United States Patent [19]

Lopresti

[11] 4,300,196

[45] Nov. 10, 1981

[54] METHOD OF ADJUSTING CIRCUIT COMPONENTS

[75] Inventor: Philip V. Lopresti, Hopewell Township, Mercer County, N.J.

[73] Assignee: Western Electric Co., Inc., New York, N.Y.

[21] Appl. No.: 613,674

[22] Filed: Sep. 15, 1975

[51] Int. Cl.[3] .................... G05B 23/02; G01R 35/00

[52] U.S. Cl. .................................. 364/489; 364/481; 364/571; 364/579

[58] Field of Search .................. 235/151.31, 150, 152; 444/1; 340/172.5; 364/489, 481-483, 579

[56] References Cited

U.S. PATENT DOCUMENTS

| | | | |
|---|---|---|---|
| 3,393,301 | 7/1968 | Valstar | 235/151.31 |
| 3,643,156 | 2/1972 | Stewart et al. | 235/151.31 |
| 3,681,782 | 8/1972 | Scanlon | 444/1 |
| 3,702,003 | 10/1972 | Ramirez, Jr. et al. | 444/1 |
| 3,723,257 | 3/1973 | Bhattacharyya | 204/228 |

OTHER PUBLICATIONS

Dupcak, J. et al.; "The Manufacture of Thin-Film Active Filters", *The Western Electric Engineer,* Jul. 1974, pp. 18-25.

Bekey et al.; "Parameter Optimization by Random Search Using Hybrid Computer Techniques"; *Proceedings-Fall Joint Computer Conference,* 1966, pp. 191-200.

Balaban et al;, "Statistical Analysis for Practical Circuit Design"; *IEEE Transactions on Circuits and Systems;* Feb. 1975, pp. 100-108.

*Primary Examiner*—Errol A. Krass

*Attorney, Agent, or Firm*—G. D. Green; D. J. Kirk

[57] ABSTRACT

Disclosed are methods of controlling the adjustment of a machine-adjustable component in a circuit wherein a feedback factor relates a change in a monitor parameter to a compensating change in the value of the adjustable component; and wherein, by machine means, a value for the change in the monitor parameter is determined, a target value for the adjustable component is calculated from the monitor parameter change and the feedback factor, and the adjustable component is adjusted to substantially its target value.

20 Claims, 8 Drawing Figures

METHOD OF ADJUSTING CIRCUIT COMPONENTS

BACKGROUND OF THE INVENTION

1. Field of the Invention

This invention relates to a machine method of adjusting circuits, and more particularly, to a machine method of controlling the adjustment of adjustable circuit components wherein target values are calculated for components to be adjusted.

2. DESCRIPTION OF THE PRIOR ART

Methods of machine adjustment of adjustable components in electronic circuits are well known. For example, an article by James Dupcak and Roger H. DeGroot entitled "The Manufacture of Thin-Film Active Filters" on pp. 18–25 of *The Western Electric Engineer* dated July, 1974 describes how components in a thin-film filter circuit can be machine-adjusted to tune the filter circuit.

In the method described in the above article, non-adjustable components comprising capacitors are measured, then the measured values are used by a digital computer for calculating target values for adjustable components comprising resistors. The adjustable resistors are then trimmed to their target values, within narrow tolerance limits, using an anodizing process. The resulting parameters of the circuit being adjusted will be within tolerance limits if all the components are trimmed within their tolerance limits.

An adjustable component, such as a resistor, can be adjusted to be within relatively wider tolerance limits in a shorter time than it can be adjusted to be within relatively narrower tolerance limits. If a circuit such as that in the above article is to have its parameters typically within specified limits, and if the target values of its adjustable components are all calculated before any of the adjustable components are trimmed, the adjustable components must be trimmed to quite narrow tolerances, such as 0.3%. In contrast, if the measured value of an already-trimmed first adjustable component could be fed back into the calculations before a second adjustable component were trimmed, the target value of the second component could be chosen to compensate for error in the first component, and so on, and all the adjustments could be made to wider tolerances, for example, 0.6%. Heretofore, such a process has not been practical because of the complicated calculations necessary to incorporate errors of prior adjustments into target values for subsequent adjustments. Thus, it is a difficulty with prior-art component adjusting methods that the precision adjustments necessary require substantial time.

An adjustment method wherein target values for passive circuit components are calculated from theoretical circuit relationships and the components are adjusted without actual operation of the circuit is called deterministic adjustment. Typically, deterministic adjustment is performed on an incomplete circuit before active elements are assembled into the circuit, and when many passive components may be so far from their final values that proper operation of the circuit would not be possible even if active components were present.

Another adjustment method, functional adjustment, involves adjustment of components in a completed, operating circuit to correct operating parameters of the circuit. For example, a filter circuit can be functionally adjusted by measuring gain or phase shift at specific frequencies and adjusting components to bring the gain or phase shift within specifications. Functional adjustment can also compensate for variations in active components.

It is often convenient to perform both deterministic adjustment and functional adjustment on a circuit: a preliminary deterministic adjustment without active components in the circuit to bring passive component values into tolerance, followed by a functional adjustment after active components have been added.

A difficulty with both deterministic and functional computer-controlled component adjusting systems is setting up such a system for different configurations of adjustable circuits. In the past, it has been necessary to program the control computer in such a system to solve equations derived from the configuration of the circuit being adjusted to determine target values for the adjustable components. For example, see Section VII of the article entitled "RC Active Filters for the D3 Channel Bank," by R. A. Friedenson, R. W. Daniels, R. J. Dow, and P. H. McDonald in the March 1975 issue of *The Bell System Technical Journal*. Encoding such equations requires the services of skilled programmers, and solving such equations to determine target values is inefficient and time consuming in the small process-control computers typically used to control circuit adjusting systems.

It is desirable, therefore, to devise both deterministic and functional methods of adjusting circuit components that will be faster than prior art systems, that will enable adjustments to be made with wider tolerances on individual components, and that can be easily implemented on a small process-control computer for different circuit configurations.

SUMMARY OF THE INVENTION

The invention comprises a method of controlling the adjustment of a machine-adjustable component in a circuit. In a preliminary computing step, a feedback factor is determined that relates a change in a monitor parameter expressing a characteristic of the circuit to a compensating change from design value in the adjustable component. By machine means, the circuit is measured to determine any change in the monitor parameter; a target value for the adjustable component is calculated from the design value of the adjustable component, the monitor parameter change, and the feedback factor; and the adjustable component is adjusted to substantially its target value.

Embodiments are disclosed for controlling the adjustment of adjustable components in both incomplete circuits and completed operating circuits.

These and other aspects of the invention will be apparent from the accompanying drawings and the detailed description.

DETAILED DESCRIPTION

Characteristics of an electric circuit, such as a filter circuit, can be expressed in terms of various parameters. Such parameters include coefficients in a transfer function that describes the circuit, and measurable relationships between various signals in an operating circuit. I have discovered that a small computer controlling a system for adjusting components in such a circuit can be programmed to accumulate changes in such parameters "on line" as the components are adjusted and measured, and to determine target values for unadjusted components using the accumulated parameter changes. This approach effectively incorporates measured values of non-adjustable and adjusted components into the determination of target values for unadjusted components, and allows the use of relatively wider component-adjustment tolerances. In the following description, parameters used for keeping track of component adjustments will be called monitor parameters.

More specifically, in a deterministic system for adjusting components in a circuit that may be incomplete or non-operating, changes in monitor paramters are calculated on line from measured values of adjustable and non-adjustable components, using senstivity factors determined "off line," and changes from design values for components still to be adjusted are calculated on line from accumulated monitor parameter changes, using feedback factors determined off line. It will be clear that an adjustable component, after it is adjusted, can also be considered as a non-adjustable component.

In a functional system for adjusting components in a completed, operating circuit, changes in adjustable components are determined on line to compensate for deviations in measurable monitor parameters from desired values, using feedback factors determined off line.

Figure 1:
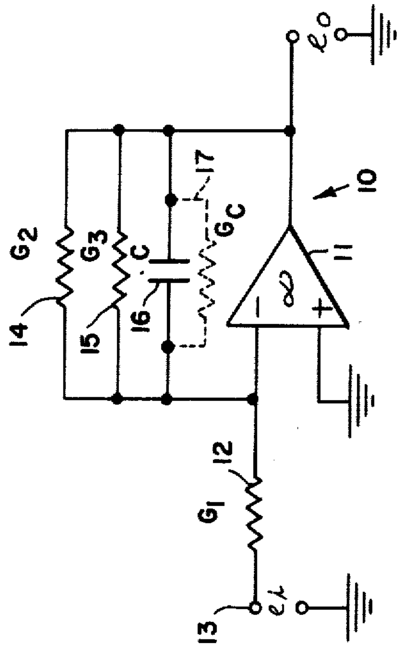
FIG. 1 is a schematic diagram of a feedback amplifier useful in explaining the principles of the invention.

FIG. 1 is a schematic diagram of a feedback amplifier that will be useful in explaining the principles of the invention, as used in a deterministic adjusting system. Referring to FIG. 1, feedback amplifier 10 comprises operational amplifier 11 assumed to have infinite gain, resistor 12 having a conductance $G_1$ connected between input terminal 13 and the (−) input terminal of operational amplifier 11, and the parallel combination of resistors 14 and 15 having respective conductances $G_2$ and $G_3$, and capacitor 16 having capacitance C connected between the output and the (−) input of operational amplifier 11. The magnitude of conductance 17, identified by $G_C$, is determined from the measured dissipation factor of capacitor 16. Capacitor 16 is considered to be non-adjustable and resistors 12, 14, and 15 are considered to be adjustable.

The transfer function of feedback amplifier 10 can be expressed by the equation:

$$H(s) = -G_1/(G_2+G_3+G_C+sC) \quad (1)$$

Rearranged into pole-zero form where s is the Laplace-transform complex-frequency variable.

$$H(s) = -(G_1/C)\{l/[s+(G_2+G_3+G_C)/C]\} \quad (2)$$

Equation 2 can be rewritten $$H(s) = -K[i/(s+A)] \quad (3)$$

where $$K = G_1/C \quad (4)$$

and $$A = (G_2+G_3+G_C)/C \quad (5)$$

In equation (4), transfer-function coefficient K is shown to be a function of capacitance C and conductance $G_1$. The sensitivity factor relating K to a change in C can be expressed by the partial differential $\delta K/\delta C$. Similar sensitivity factors can be formulated relating transfer-function coefficient A to changes in each of the component values shown in equation (5). For example, the sensitivity factors for coefficient A with respect to capacitor 16 are $\delta A/\delta C$ for its capacitance value C and $\delta A/\delta G_C$ for its conductance value $G_C$.

The total change from design value possible for coefficient K can be written $$dK = (\delta K/\delta C)\,dC + (\delta K/\delta G_1)dG_1 \quad (6)$$

where dC is a change from the design value of C and $dG_1$ is a change from the design value of $G_1$. Similarly, the total change from the design value possible for coefficient A can be written $$dA = (\delta A/\delta C)dC + (\delta A/\delta G_C)BD + (\delta A/\delta G_2)dG_2 + (\delta A/\delta G_3)dG_3 \quad (7)$$

where D is the measured value of the dissipation factor of capacitor 16, B is a scale factor for converting dissipation factor to conductance, and $dG_2$ and $dG_3$ are changes from the design values of $G_2$ and $G_3$, respectively.

Equations (4) and (6) show that both capacitor 16 and resistor 12 influence coefficient K, and equations (5) and (7) show that capacitor 16 and resistors 14 and 15 all influence coefficient A. Since capacitor 16 is non-adjustable and resistors 12, 14, and 15 are adjustable, the target conductance of resistor 12 can be chosen with reference to dK to compensate for the change in K resulting from a change from design value in C; and the target values of resistors 14 and 15 can be chosen with reference to dA to compensate for the change in A resulting from changes from design values in C and $G_C$. The design value of $G_C$, the conductance resulting from capacitor dissipation, is considered to be zero.

According to the invention, a target value for an adjustable component is determined from the design value of that component, the current changes in monitor parameters, and feedback factors relating the monitor parameters to that component. In the present example, the monitor parameters can be the transfer-function coefficients K and A. The target value of conductance for one of the adjustable resistors can be expressed generally as $$\hat{G} = F_{G,K}dK_i + F_{G,A}dA_i + G \quad (8)$$

where $\hat{G}$ is the target conductance, $F_{G,K}$ and $F_{G,A}$ are the feedback factors for the resistor with respect to monitor parameters K and A, respectively; $dK_i$ and $dA_i$ are the current accumulated changes in the monitor parameters, and G is the design conductance of the resistor.

In simple cases, it can be shown that the feedback factor relating a monitor parameter to an adjustable component is merely the reciprocal of the sensitivity factor relating that component to that parameter multiplied by −1. For example, in equation (6), if dK is set equal to zero to correspond to no change from design value in monitor parameter K, the equation can be rewritten $$dG_i = (-l/\delta K/\delta G_1)[(\delta K/\delta C)dC] \quad (6A)$$

This equation shows that the change from design value dG required in conductance G for dK to be zero is the change in monitor parameter K resulting from dC, as represented by the factor $[(\delta K/\delta C)dC]$, multiplied by the factor $(-l/\delta K/\delta G_1)$, which is the negative reciprocal of the sensitivity factor relating $G_1$ to K. Thus, $F_{G1,K} = (-l/\delta K/\delta G_1)$.

In cases where more than one adjustable component affects a given monitor parameter, or where more than one monitor parameter is affected by a given adjustable component, the determination of feedback factors can be more complex. For example, equation (7) shows that both conductances $G_2$ and $G_3$ affect dA, so that a determination must be made as to how changes in target values for $G_2$ and $G_3$ are to be apportioned to bring dA to zero in the presence of non-zero values for dC and D.

As will be described in more detail below, components can be adjusted either singly or together. If more than one of the components affecting a given monitor parameter are to be adjusted together, the feedback factors relating that monitor parameter to the components should be chosen to apportion any needed adjustment among the components to avoid overcompensating for a change in the parameter. Conversely, if components affecting the same parameter are adjusted separately, any residual change in the monitor parameter remaining because of error in an earlier adjustment of one of the components can be reduced by a subsequent adjustment of another of the components, and the total adjustment need not then be apportioned.

Referring again to equation (7), if resistors 14 and 15 are adjusted separately, the feedback factors relating monitor parameter A to these resistors can again be the negative reciprocals of the corresponding sensitivity factors. However, if resistors 14 and 15 are adjusted together, the feedback factors must apportion any necessary adjustment between these resistors. The apportionment could be equal, for example $$F_{G2,A} = -0.5(l/\delta A/\delta G_2)$$

and $$F_{G3,A} = -0.5(l/\delta A/\delta G_3)$$

In more complex circuits than this example, the determination of feedback factors can be accomplished by an optimization procedure, as will also be described in more detail below.

For simplicity in explanation, the sensitivity and feedback factors described above have been shown as partial derivatives, for example, the sensitivity factor relating coefficient K to capacitance C is shown as $-\delta K/\delta C$; and the changes from design value in the components have been expressed as absolute changes, for example, dC is used for the change in capacitance C. It is more convenient in the control computer for the component changes to be expressed as percent changes. For example, equation (6) can be rewritten $$dk = [C(\delta K/\delta C)](dC/C) + [G_1(\delta K/\delta G_1)](dG_1/G_1) \quad (6B)$$

to include the design values C and $G_1$ in the respective terms. The appropriate design value is used as a divisor in the change term, e.g., (dC/C), and as a multiplier in the sensitivity-factor term, e.g., $[C(\delta K/\delta C)]$. Similarly, the feedback factors can also include design values as divisors, e.g., $F_{G1,K} = -(l/\delta K/\delta G_1)$, to give percent changes in target value. For such feedback factors, equation (8) would then be rewritten $$\hat{G} = (F_{G,K}dK_i + F_{G,}dA_{i+l})G \quad (8A)$$

To simplify number manipulation in the control computer, it is desirable for the sensitivity and feedback factors to have magnitudes close to unity. To this end, scaling multipliers can also be incorporated in the sensitivity and feedback factors. Methods of using such scaling multipliers will be apparent to one skilled in the art.

Figure 2:
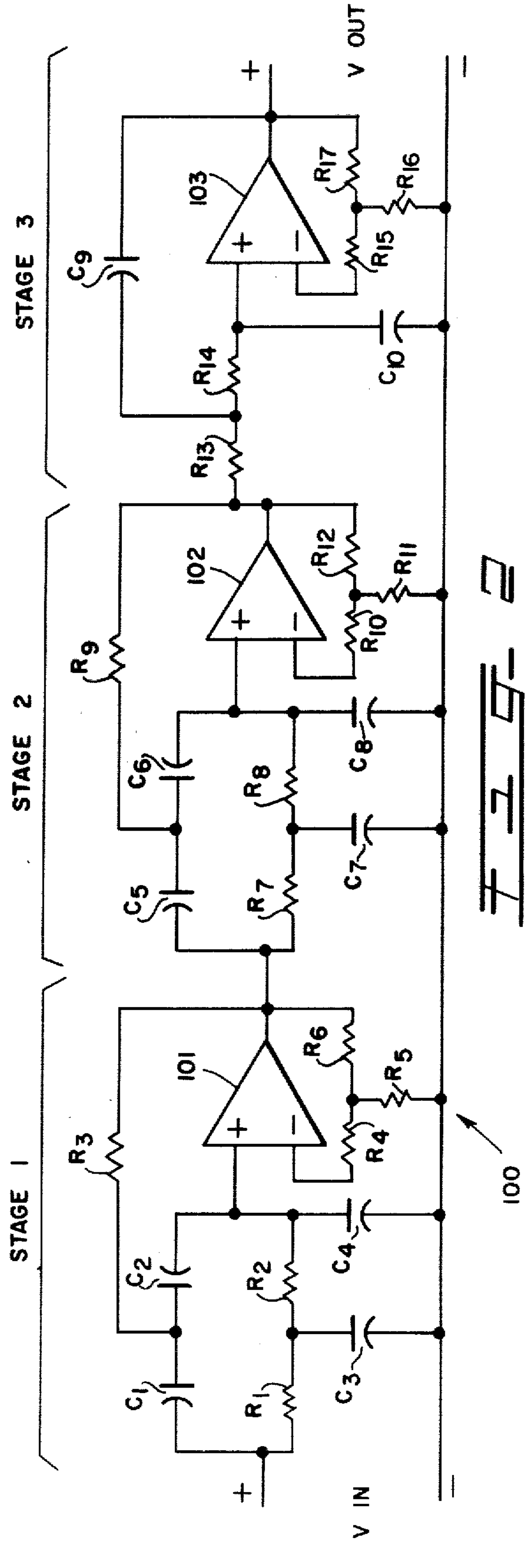
FIG. 2 is a schematic diagram of an exemplary filter circuit having components that can be adjusted using the methods of the invention.

FIG. 2 is a circuit diagram of a three-stage filter circuit 100, which can be characterized as a six-pole, four-zero, elliptic, low-pass filter, and which is typical of the circuits that can be adjusted by using the methods of the invention. Each stage of filter 100 comprises capacitors, resistors, and an operational amplifier; for example, stage 1 comprises capacitors $C_1$, $C_2$, $C_3$, and $C_4$; resistors $R_1$, $R_2$, $R_3$, $R_4$, $R_5$, and $R_6$; and operational amplifier 101. The capacitors and resistors in circuit 100 would typically be fabricated as thin-film components on a substrate, and operational amplifiers 101, 102, and 103 would be semiconductor devices fabricated separately and bonded to the substrate in an assembly step.

As an example of the use of invention for deterministic adjustment of components, assume that in circuit 100 the capacitors are non-adjustable, the resistors are adjustable by anodizing, and operational amplifiers 101, 102, and 103 are not yet in the circuit. The resistors can be adjusted by apparatus such as that shown in FIG. 3.

Figure 3:
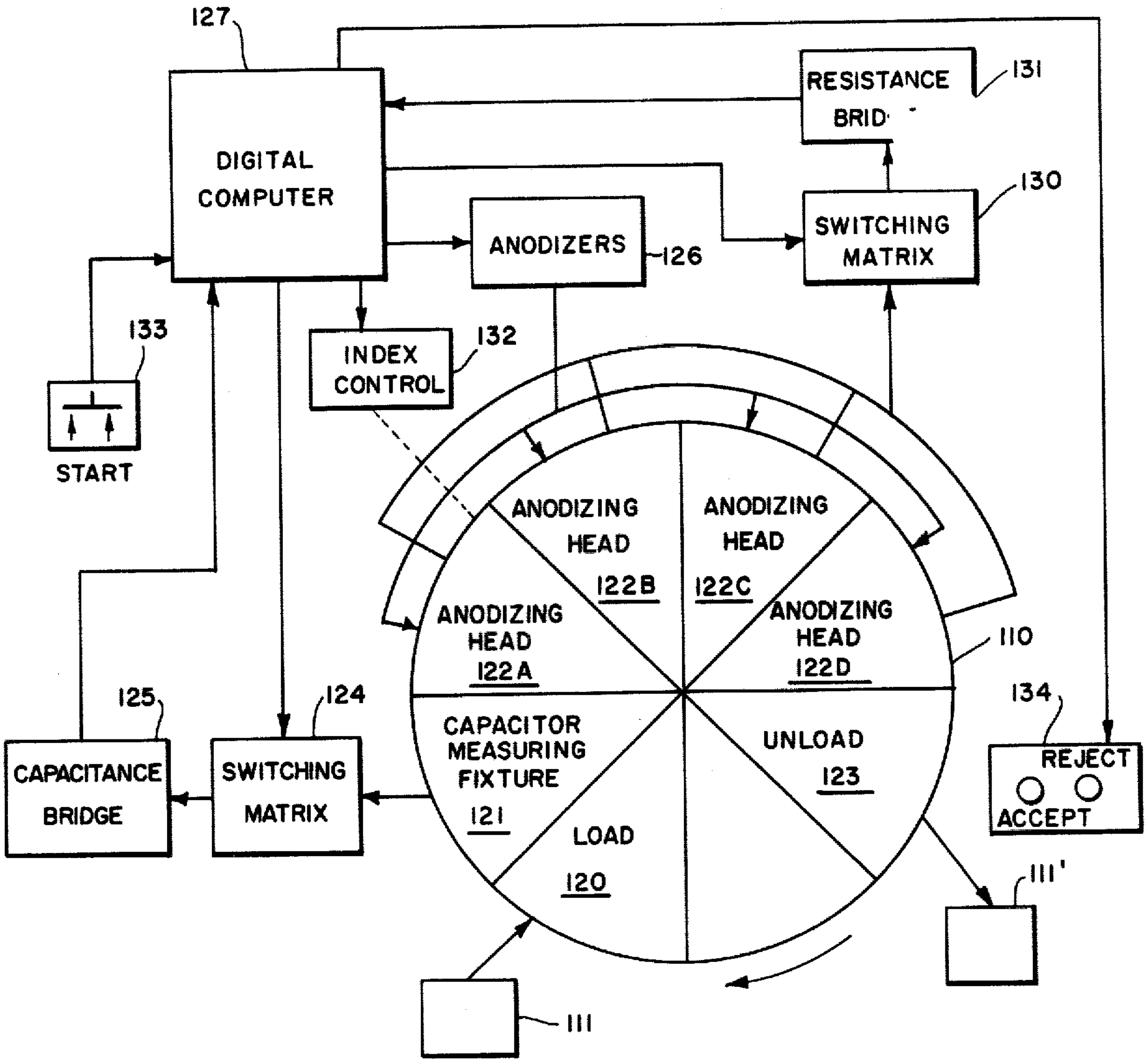
FIG. 3 is a schematic diagram of exemplary apparatus for deterministic adjustment of circuit components according to the method of the invention.

FIG. 3 is a schematic diagram of an embodiment of illustrative apparatus for deterministic component adjustment that can be used for performing the method of the invention. Such apparatus is well known, for example, as described in the Dupcak et al. article noted above.

Referring to FIG. 3, rotary indexing table 110 has associated therewith load station 120, capacitor measuring fixture 121, multiple resistor anodizing heads 122A, 122B, 122C, and 122D, and unload station 123. Probes in measuring fixture 121 that contact capacitor terminals on the workpiece 111 in fixture 121 are connected through switching matrix 124 to capacitance bridge 125. Anodizers 126 are connected to electrolyte slugs in anodizing heads 122A, 122B, 122C, and 122D. Each resistor to be adjusted is associated with a particular electrolyte slug positioned in one of the anodizing heads to contact that resistor, and a particular anodizer, which supplies selected current pulses through the electrolyte slug to anodize that resistor. Probes in anodizing heads 122A, 122B, 122C, and 122D that contact resistor terminals on the workpieces 111 in the anodizing heads are connected through switching matrix 130 to resistance bridge 131.

Digital computer 127 is connected to control switching matrices 124 and 130 and anodizers 126, and to accept measurement information from capacitance bridge 125 and resistance bridge 131. Computer 131 is also connected to control the rotation of table 110 by means of index control 132, to accept a START signal from start button 133, and to display ACCEPT or REJECT indications on indicator 134.

In operation, a workpiece 111 is loaded at station 120, rotated through fixture 121 where the capacitors thereon are measured, through anodizing heads 122A, 122B, 122C, and 122D, where the resistors thereon are adjusted and measured, and unloaded at station 123 as an adjusted workpiece 111'. Switching matrix 124, which can be a bank of relays, is controlled by computer 127 to selectively connect the capacitors on the workpiece 111 in fixture 121 to capacitance bridge 125. Similarly, switching matrix 130, which can also be a bank or relays, is controlled by computer 127 to selectively connect the resistors on the workpieces 111 in anodizing heads 122A, 122B, 122C, and 122D to resistance bridge 131. Switching matrix 130 also selectively connects the probes contacting terminals of resistors being anodized to a return path for current from anodizers 126.

Measurements from resistance bridge 131 are used by computer 127 to control anodizers 126 to adjust the resistors to their target values. Since an anodizing process can only increase the resistance of a resistor, the resistance values on an unadjusted circuit 111 will be somewhat less than design values for the resistors.

Typically, each anodizing head will be configured to anodize four or five resistors at a time. Since measuring the resistor being anodized is inherent in the anodizing process, the final adjusted value of each anodized resistor is readily made available to computer 127 so that computer 127 can potentially incorporate that value into its calculations of target values for resistors yet to be adjusted. For example, measured values of resistors adjusted at head 122A can be used in calculating target values for resistors to be adjusted at head 122B. However, such calculations have previously been beyond the capabilities of the type of computer that would normally be used for computer 127, as performed by solving equations defining the circuit on workpieces 111. An example of such a computer is the PDP-11-20 computer manufactured by the Digital Equipment Corporation having 24K of core. With the methods of the invention, however, component values can be determined on line by such a computer to compensate for values of components already adjusted. The result is that circuits can be adjusted to have operating parameters within tolerances while the tolerances on individual components are wider than would be necessary without using the methods of the invention.

It must be emphasized again that the apparatus shown in FIG. 3 is merely illustrative, and many other well-known types of apparatus can be used with the methods of the invention. It must also be emphasized that resistors need not be the only adjustable components; for example, capacitors and inductors can also be adjusted by methods such as anodization or laser trimming. These and other adjustable components can be adjusted using the methods of the invention.

For deterministic adjustment of components in a multi-stage circuit such as circuit 100 in FIG. 2, transfer function coefficients, sensitivity factors, and feedback factors for each stage are preferably handled separately, even though components from each stage are adjusted in the same adjusting step. For example, using the apparatus shown in FIG. 3, an adjustment sequence for the resistors of circuit 100 can be chosen as follows: anodizing head 122A adjusts resistors $R_1$, $R_6$, $R_{11}$, and $R_{13}$; anodizing head 122B adjusts resistors $R_4$, $R_5$, $R_7$, $R_{12}$, and $R_{14}$; anodizing head 122C adjusts resistors $R_3$, $R_9$, $R_{10}$, and $R_{16}$; and anodizing head 122D adjusts resistors $R_2$, $R_8$, $R_{15}$, and $R_{17}$. Digital computer 127 is programmed to determine target values for the adjustable resistors for a particular stage from the accumulated transfer-function coefficient errors and the sensitivity and feedback factors for that stage. Thus, at the time that table 110 is indexed, computer 127 determines target values for the particular resistors in each stage to be adjusted by each of the anodizing heads 122A, 122B, 122C, and 122D.

Figure 4:
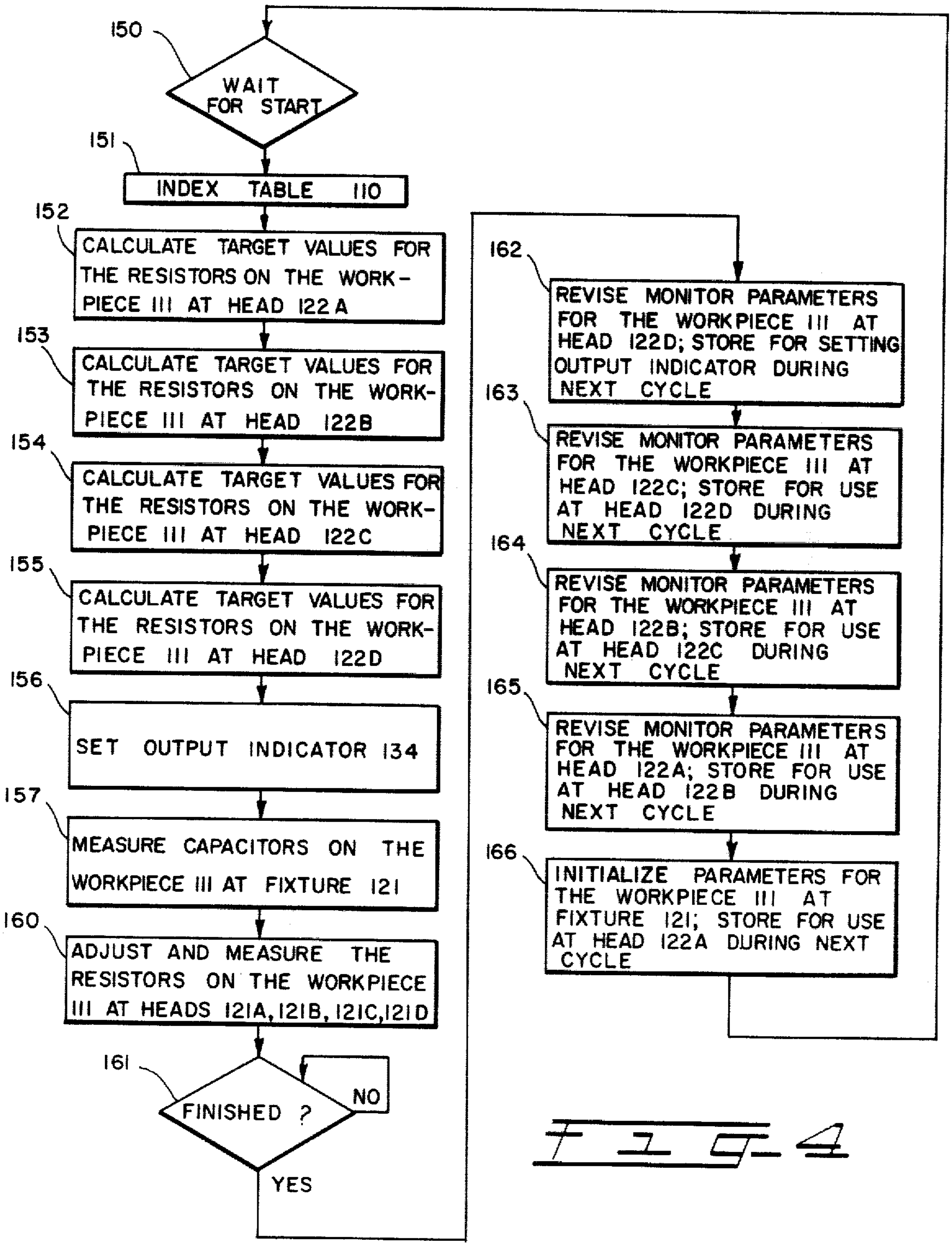
FIG. 4 is a flow chart of a computer program for a digital computer in the apparatus of FIG. 3.

FIG. 4 is a flow chart of a simplified version of a control program for computer 127 for use with workpieces 111 each having the capacitors and adjustable resistors of a single circuit stage thereon, for example, of the type of circuit stage shown in FIG. 2, and wherein transfer-function coefficient changes are used as monitor parameters in adjusting the resistors. The single-stage limitation is merely to simplify the following description; it will be apparent to those skilled in the art that a workpiece having components for a multi-stage circuit, such as for the entire circuit shown in FIG. 2, could be handled by repeating the appropriate program steps for each stage.

Exemplary FORTRAN language statements will be given in describing the program charted in the blocks of FIG. 4, and also in the subsequent descriptions of the flow charts in FIGS. 6 and 8. It will be apparent to those skilled in the art that numerous other arrangements of FORTRAN statements, or statements in other programming languages, could be used for the same purpose without departing from the teachings of the invention. As also will be clear to those skilled in the art, the FORTRAN program statements set forth below must be supplemented by appropriate data definitions and compiled into suitable object coding for the particular computer used for computer 127.

In the following description, specific program statements are not given for interactions between computer 127 and the various other hardware elements shown in FIG. 3 to be connected to computer 127. It is considered that those skilled in the art would find no difficulty in programming computer 127 to communicate with and control these hardware elements. Such programming is well known in the art, as is apparent from the Dupcak et al. article noted above.

The blocks in the flow chart shown in FIG. 4 will now be described.

Block 150

Computer 127 waits for START button 133 to be depressed by the operator, indicating that manual unloading and loading operations are complete.

Block 151

Computer 127 initiates the indexing of table 110 by index control 132.

Block 152

Computer 127 calculates target values for an adjustable resistor on the workpiece 111 arriving at anodizing head 122A using monitor parameters stored for that workpiece, feedback factors, and design values for the adjustable components by executing program statements such as:

| | | |
|---|---|---|
| | RN = FRA | (1A) |
| | NR = NRA | (2A) |
| | DO 101 J = 1,NPAR | (3A) |
| 101 | PAR(J) = PARA(J) | (4A) |
| | CALL TARGET | (5A) |

FRA, NRA, and NPAR are constants loaded into computer 127 as design data. FRA is the identification number of the first resistor to be adjusted at anodizing head 122A, NRA is the number of resistors to be adjusted at head 122A, and NPAR is the number of monitor parameters being maintained for workpieces 111. PARA is the set of monitor parameters for the workpiece 111 arriving at head 122A; RN, NR, and PAR are variables being set up for subroutine TARGET.

Subroutine TARGET comprises statements such as:

| | | |
|---|---|---|
| | DO 2 I = 1,NR | (6) |
| | DG = 0 | (7) |
| | DO 3 J = 1,NPAR | (8) |
| 3 | DG = DG − FB(J,RN)*PAR(J) | (9) |
| | TG(RN) = (1. + DG)*GD(RN) | (10) |
| | DO 4 J = 1,NPAR | (11) |
| 4 | PAR(J) = PAR(J) + SRES(J,RN)*DG | (12) |
| 2 | RN = RN + 1 | (13) |
| | RETURN | (14) |

FB, GD, and SRES are constants loaded into computer 127 as design data. FB is the table of feedback factors relating the monitor parameters to percent changes from the design values of the adjustable resistors. GD is the set of design conductances for the adjustable resistors. TG is the set of calculated target conductances for the adjustable resistors. SRES is the table of sensitivity factors relating percent changes from the design values of the adjustable resistors to consequent changes in the monitor parameters. DG is an intermediate variable indicating the change in conductance from the design value for the adjustable resistor whose target value is being calculated. Statement (9) develops DG and statement (10) converts DG into the actual target conductance, TG. Clearly, a target resistance could be calculated instead of target conductance TG, if desired. Statement (12) uses DG and SRES to reflect, in monitor parameters PAR, the change from design value just determined, so that the target values to be determined for the remaining resistors in the group to be adjusted by the current head also reflect the change. Thus, even though an adjustable component has not yet been adjusted, its target value is incorporated into the calculation of target values for other adjustable components.

Blocks 153, 154, and 155

These blocks are substantially identical to block 152, except that design data and parameters for the appropriate anodizing head 122B, 122C, or 122D are used. For example, the statements for block 153 for head 122B can be written:

| | | |
|---|---|---|
| | RN = FRB | (1B) |
| | NR = NRB | (2B) |
| | DO 102 J = 1,NPAR | (3B) |
| 102 | PAR(J) = PARB(J) | (4B) |
| | CALL TARGET | (5B) |

FRB and NRB are design data respectively identifying the first resistor and the number of resistors to be adjusted by head 122B, and PARB is the set of monitor parameters for the workpiece 111 arriving at head 122B. The same TARGET subroutine is, of course, used by all blocks 152, 153, 154, and 155.

Block 156

Computer 127 sets output indicator 131 to display the status of the workpiece 111 at unload station 123. The state to be displayed by the indicator 134 is determined by executing statements such as:

| | | |
|---|---|---|
| | DO 5 J = 1,NPAR | (15) |
| | APAR = ABS(PARU(J)) | (16) |
| 5 | IF(APAR . GT . HPAR(J))GO TO 100 | (17) |
| | Set indicator 134 to ACCEPT, and go to block 157 | (18) |
| 100 | Set indicator 134 to REJECT, and go to block 157 | (19) |

ABS is a routine to find the absolute value of one of the monitor parameters PARU. As will be explained, the monitor parameters PARU are calculated for the workpiece 111 at the last anodizing head 122D, before that workpiece leaves that head, to reflect the final status of the monitor parameters for that workpiece. HPAR is a set of maximum permissible magnitudes for the monitor parameters. APAR is an intermediate variable having the magnitude of the monitor parameter being checked. Statements (18) and (19) describe the actions performed by computer 127 with respect to indicator 134.

Clearly, other methods of determining acceptable or unacceptable workpieces 111' from the final monitor parameters could be implemented in this step. For example, it may only be necessary to check the magnitudes of some of the parameters for a satisfactory determination.

Block 157

Computer 127 controls switching matrix 124 and accepts measurements from capacitance bridge 125 of the capacitance and dissipation factor for each capacitor on the workpiece 111 at measuring fixture 121. These measurements may be done sequentially, and at the same time as the resistor adjustments to be described for block 160.

Block 160

Computer 127 controls anodizers 126 and switching matrix 130 and accepts measurements from resistance bridge 131 to anodize the various resistors on the workpieces 111 at anodizing heads 122A, 122B, 122C, and 122D to their target conductances.

Block 161

Computer 127 monitors the measuring and anodizing operations initiated in blocks 157 and 160. These operations may be time-shared, that is, various measuring and anodizing operations may be in progress simultaneously.

Block 162

Computer 127 revises the set of monitor parameters PARD for the workpiece 111 at anodizing head 122D to incorporate the actual measured values of the components adjusted at that head. The revised parameters are then stored as the set PARU for use in the steps of block 156 during the next cycle. Statements are executed such as:

```
      LRN = FRD                     (22D)
      HRN = FRD + NRD               (23D)
      DO 604 J = 1,NPAR             (24D)
604   RPAR(J) = PARD(J)             (25D)
      CALL REVISE                   (26D)
      DO 704 J = 1,NPAR             (27D)
704   PARU(J) = RPAR(J)             (28D)
```

FRD and NRD are design data respectively identifying the first resistor and the number of resistors adjusted at head 121D. PARD is the set of monitor parameters for the workpiece 111 at head 121D. LRN, HRN, and RPAR are intermediate variables set up for subroutine REVISE.

Subroutine REVISE comprises statements such as:

```
      DO 8 I = LRN,HRN                       (29)
      DGM = (GM(I) - GD(I))/GD(I)            (30)
      DO 8 J = 1,NPAR                        (31)
8     RPAR(J) = RPAR(J) + SRES(J,I)*DGM      (32)
      RETURN                                 (33)
```

GM is the set of actual measured conductances of the resistors adjusted and measured at heads 122A, 122B, 122C, and 122D. DGM is an intermediate variable indicating the percent change of the measured conductance with respect to the design conductance GD of a particular resistor.

Blocks 163, 164, and 165

These blocks are substantially identical to block 162. Design data and monitor parameters for the associated anodizing head are used, and statement (28) for each block sets the monitor parameters for the next head that will receive the workpiece 111 to which those monitor parameters pertain. For example, the statements for block 163 for head 122C can be written:

```
      LRN = FRC                     (22C)
      HRN = FRC + NRC               (23C)
      DO 603 J = 1,NPAR             (24C)
603   RPAR(J) = PARC(J)             (25C)
      CALL REVISE                   (26C)
      DO 703 J = 1,NPAR             (27C)
703   PARD(J) = RPAR(J)             (28C)
```

FRC and NRC are design data respectively identifying the first resistor and the number of resistors adjusted at head 121C. PARC is the set of monitor parameters for the workpiece 111 at head 121C. The same REVISE subroutine is, of course, used by all blocks 162, 163, 164, and 165. Note that for block 163, statement 28C stores the revised monitor parameters for the workpiece 111 at head 122C to be used by block 155 during the next cycle for calculating target conductances for that workpiece when that workpiece arrives at anodizing head 122D.

Similarly, statement (28B) in block 164 is written:

```
702   PARC(J) = RPAR(J)             (28B)
```

and statement (28A) in block 165 is written:

```
701   PARB(J) = RPAR(J)             (28A)
```

Thus, actual measured values of components are incorporated into target values for components yet to be adjusted.

Block 166

Computer 127 calculates the initial monitor parameters for the workpiece 111 at capacitor measuring fixture 121 according to statements such as:

```
      DO 9 I = 1,NCAP                               (34)
      DC(I) = (CM(I) - CD(I))/CD(I)                 (35)
9     CG(I) = (CONV*DF(I)*CM(I))/CD(I)              (36)
      DO 10 J = 1,NPAR                              (37)
      PARA(J) = 0                                   (38)
      DO 10 I = 1,NCAP                              (39)
10    PARA(J) = PARA(J) + SCAP(J,I)*DC(I)
           + SCON(J,I)*CG(I)                        (40)
```

NCAP, CD, SCAP, and SCON are design data. NCAP is the number of capacitors. CD is the set of design values for the capacitors. SCAP is the table of sensitivity factors relating percent changes from design capacitances of the capacitors to consequent changes in the monitor parameters, and SCON is the table of sensitivity factors relating the conductances of the capacitors to consequent changes in the monitor parameters.

The design data identified above is loaded into computer 127 along with the control program itself. If the circuit configuration or component values are changed on workpiece 111, the control program stays the same, only the design data is changed.

Figure 5:
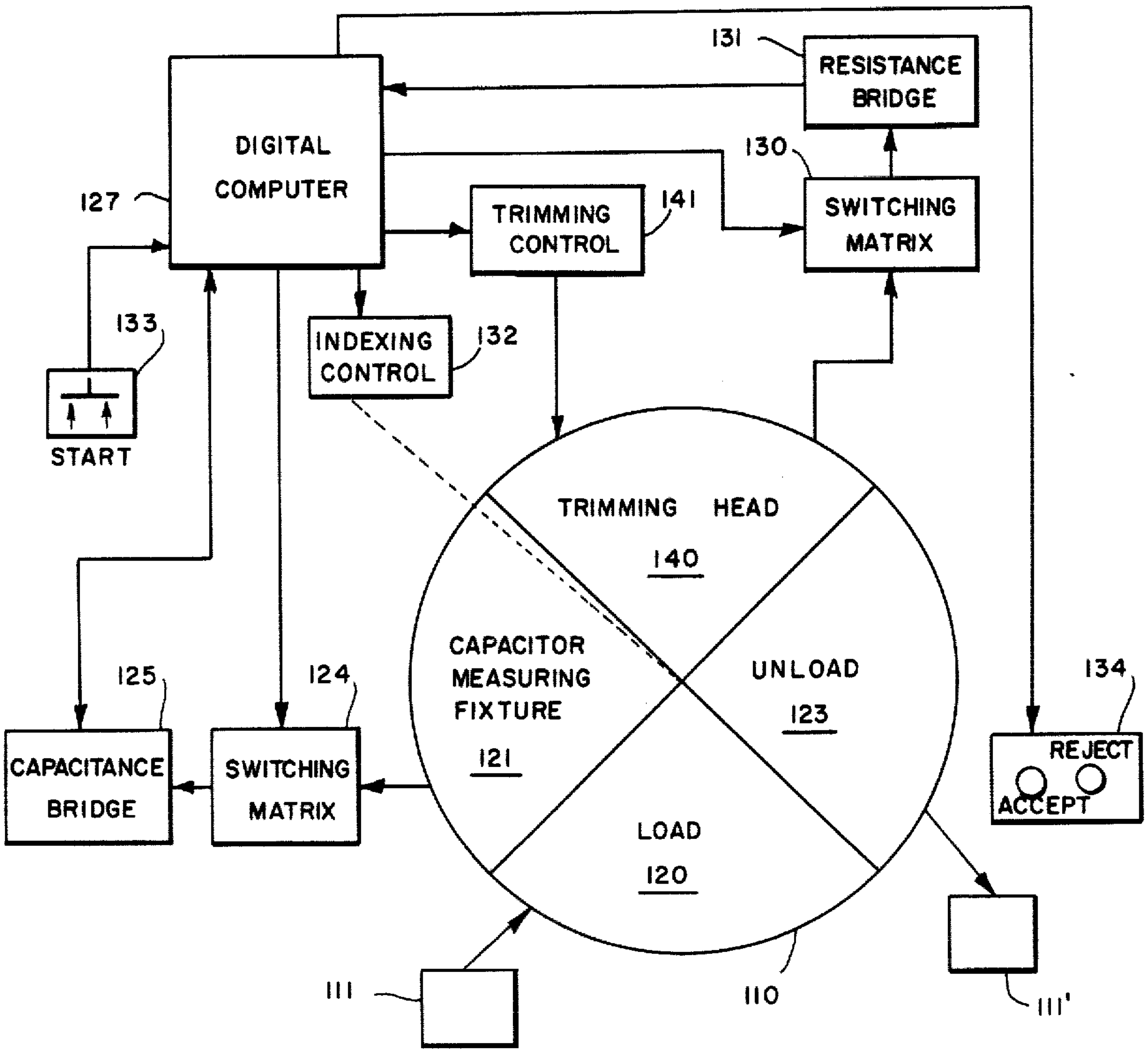
FIG. 5 is a schematic diagram of another embodiment of exemplary apparatus for deterministic adjustment of circuit components according to the method of the invention.

FIG. 5 is a schematic diagram of another embodiment of apparatus for deterministic component adjustment that can be used for performing the method of the invention, more specifically, in applications wherein each adjustable component can be adjusted separately, such as with a laser beam that can be directed to trim any component on workpiece 111 at will. Many elements of FIG. 5 are similar to like-numbered elements of FIG. 3.

Referring to FIG. 5, four-position rotary indexing table 110' has associated therewith load station 120, capacitor measuring fixture 121, trimming head 140, and unload station 123. Trimming control 141 controls trimming head 140 to adjust components, such as resistors, on workpieces 111 under the control of computer 127. Trimming head 140 can comprise, for example, a laser and means for positioning the laser beam with respect to a selected component on workpiece 111 so that the laser beam removes portions of the selected component to adjust its value. Trimming control 141 interfaces trimming head 140 to computer 127. Such apparatus is well known in the art.

The operation of FIG. 5 is similar to the operation of the apparatus of FIG. 3 except that trimming head 40 trims each adjustable component separately. Thus, after each adjustment, the measured value of the component just trimmed is available for use in calculating the target value of the next component to be adjusted. Using the methods of the invention, such calculations can be carried out by the program charted in FIG. 6.

Figure 6:
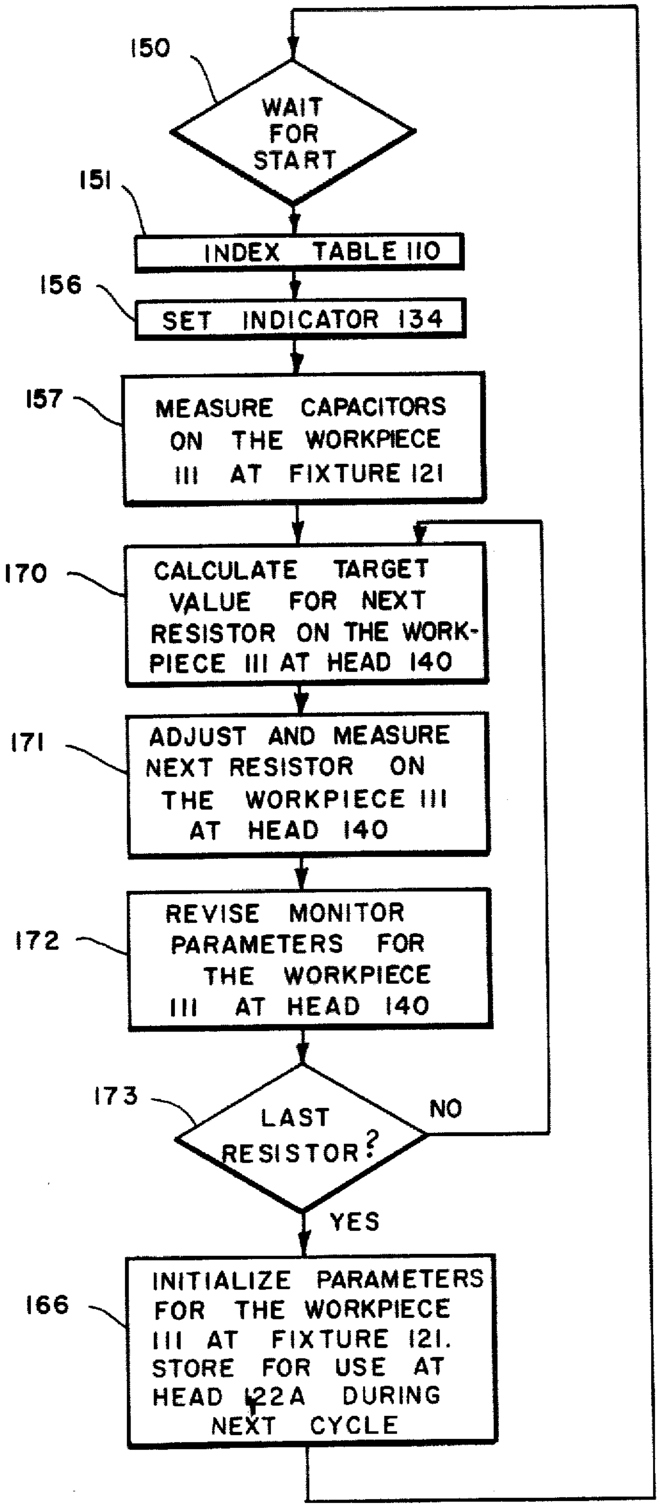
FIG. 6 is a flow chart of a computer program for a digital computer in the apparatus of FIG. 5.

Many of the blocks in FIG. 6 are similar to identically numbered blocks in the flow chart of FIG. 4. Blocks 170, 171, 172, and 173 will now be described. Many of the same mnemonic symbols will be used as in the statements for the program of FIG. 4.

Block 170

Computer 127 calculates a target value for an adjustable resistor on the workpiece 111 arriving at trimming head 140, using monitor parameters stored for that workpiece, feedback factors, and a design value for the adjustable component by executing program statements such as:

| | | |
|---|---|---|
| | RN = 0 | (50) |
| 22 | RN = RN + 1 | (51) |
| | DO 20 J = 1,NPAR | (52) |
| 20 | DG = DG − FB(J,RN)*PARA(J) | (53) |
| | TG = (1. + DG)*GD(RN) | (54) |

Block 171

Computer 127 controls the adjustment of the adjustable resistor to its target conductance by controlling trimming head 140 through trimming control 141, as guided by measurements made by resistance bridge 131, which is connected by computer 127 through switching matrix 130 to the resistor being adjusted. Computer 127 contains the final measured value of the resistor after adjustment.

Note that the design data for workpiece 111 loaded in computer 127 must include information defining the position of each resistor on workpiece 111 for controlling trimming head 140.

Block 172

Computer 127 revises the monitor parameters to reflect the measured value of the resistor adjusted in block 171 by executing statements such as:

| | | |
|---|---|---|
| | DGM = (GM(RN) − GD(RN))/GD(RN) | (55) |
| | DO 21 J = 1,NPAR | (56) |
| 21 | PARA(J) = PARA(J) + SRES(J,RN)*DGM | (57) |

Block 173

Computer 127 determines whether the last component on the workpiece 111 at trimming head 140 has been adjusted by executing statements such as:

| | | |
|---|---|---|
| | IF(RN . LT . HRN)GO TO 22 | (58) |
| | DO 23 J = 1,NPAR | (59) |
| 23 | PARU(J) = PARA(J) | (60) |

If the resistor number, RN, is less than the highest resistor number, HRN, statements comprising blocks 170 and 171 are repeated; if RN equals HRN, the set of monitor parameters PARU for block 156 is set equal to the set of monitor parameters PARA.

In operation, after executing the steps of blocks 150 and 151, computer 127 sets output indicator 134 by the steps of block 156 according to the values of the monitor parameter set PARU, measures the capacitors on the workpiece 111 at fixture 121 according to the steps of block 157, calculates a target value for and adjusts and measures the current resistor, then revises the monitor parameter set PARA; repeating these steps for each adjustable resistor on the workpiece 111 at trimming head 140. After the last resistor is adjusted, the monitor parameters PARA are recalculated from capacitor values for the workpiece 111 at capacitor measuring fixture 121 by the steps of block 166.

As mentioned earlier, the sensitivity and feedback factors for the deterministic adjusting procedures are preferably calculated off line. The sensitivity factors for a given circuit can be calculated by using well-known numerical methods, for example, as discussed in an article by Thomas D. Shockley and Charles F. Morris entitled "Computerized Design and Tuning of Active Filters" in the July, 1973 issue of *IEEE Transactions on Circuit Theory*. The calculation of feedback factors is not quite so straightforward, because the component adjustment sequence must be chosen and the effects of the adjustments on the monitor parameters should be optimized. For example, it may be possible to keep one monitor parameter in tolerance only by allowing another monitor parameter to vary widely. The determination of feedback factors can be somewhat empirical and accomplishable only by trial and error. It has been found convenient to use an interactive computer program by which a designer, for a given circuit, can find values for the transfer-function coefficients that will be used for monitor parameters, choose a particular adjusting sequence for adjustable components in the circuit, assign weights to the coefficients to calculate the feedback factors, then simulate the adjustment process by a Monte Carlo technique in which component values are varied randomly to test the soundness of the choice of adjustment sequence and the assignment of coefficient weights.

An exemplary method of calculating feedback factors for a circuit having non-adjustable capacitors and adjustable resistors will now be described, although this method is not considered to be part of the invention. It is assumed that the transfer function of the circuit can be written in the form $$HK(s)=K(s^n+a_{n-1}s^{n-1}+\ldots+a_o)/(s^n+b_{n-1}s^{n-1}+\ldots+b_o)$$

where s is the Laplace transform complex-frequency variable. Thus, there are 2n+1 transfer function coefficients, K; $a_{n-1}, \ldots, a_o$; $b_{n-1}, \ldots, b_o$; each coefficient being a function of the circuit components, so that there exist 2n+1 ideal coefficient equations of the form $$K=f_o(G, C, G_C) \quad (10)$$

$$a_i=f_{i+1}(G, C, G_C)\ i=0, \ldots, n-1 \quad (11)$$

$$b_i=f_{n+i+1}(G, C, G_C)\ i=0, \ldots, n-1 \quad (12)$$

where G is a vector representing the m design conductances of the resistors in the circuit, C is a vector representing the p design capacitances, and $G_C$ is a vector representing the conductances of the capacitors. $G_C$ is assumed to be zero in the coefficient equations (10–12).

Let z be the 2n+1 vector of transfer function coefficients, and f be the 2n+1 vector of coefficient equations. In a practical case, a differential approximation can be used to estimate transfer function deviations from design values using the expression $$\delta Z = \sum_{i=1}^{p} C_i(\partial f/\partial C_i)\,(dC_i/C_i) + \sum_{i=1}^{p} C_i\,(\partial f/\partial G_{Ci})\,(dG_{Ci}/C_1) + \sum_{i=1}^{m} G_i(\partial f/\partial G_i)\,(dG_i/G_i) \quad (13)$$

The sensitivity factors such as $C_i(\delta f/\delta C_i)$ are evaluated from the design values of the components, for example, by the methods of the Shockley et al. article noted above.

For the adjustable resistors, let the vector of sensitivity factors $$h_k = G_k(\delta f/\delta G_k) \quad (14)$$

and let $$u_k = dG_k/G_k \quad (15)$$

then an equation in the form of equation (13) can be rewritten as the recursion relation $$x_{k+l} = x_k + h_k u_k k = l, \ldots, m \quad (16)$$

where x is the 2n+1 vector of accumulated transfer function coefficient errors and $x_1$ is the initial value of x after the non-adjustable capacitors have been measured, i.e., $$x_1 = \sum_{i=1}^{p} C_i\,(\partial f/\partial C_i)\,(dC_i/C_i) + \sum_{i=1}^{p} C_i\,(\partial f/\partial G_{Ci})\,(dG_{Ci}/C_i). \quad (17)$$

The vector of sensitivity factors $h_k$ converts $u_k$, a deviation from design conductance in an adjusted component, into a resulting deviation in the transfer function coefficients.

At this point it is desired to determine feedback factors that will yield target values for adjustable components such that the final coefficient errors $x_{m+l}$ and the deviations from design value of the adjustable components $u_i$ will be minimized. For this purpose, a performance index $$I(u_1, \ldots, u_m; x_1) = x'_{m+1}\,Q\,x_{m+1} + \sum_{i=1}^{m} \gamma_i u_i^2 \quad (18)$$

can be used. The first scalar term in this index, $x'_{m+l}$ $Qx_{m+l}$, represents the final coefficient errors and the second scalar term, $$\sum_{i=1}^{m} \gamma_i u_1^2,$$

represents the deviations from design value of the adjustable components. The matrix Q in the first term is a matrix of weights for the various coefficients, and the factors $\gamma_i$ in the second term are weights for the deviations of the various adjustable resistors.

Matrix Q is symmetric non-negative definite, i.e., $$q_{ij} = q_{ji} i,j = l, \ldots, r \quad (19)$$

and the term $$x'_{m+1}Qx_{m+1} \geqq 0 \quad (20)$$

The weights $\gamma_1$ are positive.

Feedback factors $F_k$ to minimize the performance index I can be found from the equation $$F_{m-i} = -(h'_{m-i}P_i)/(h'_{m-i}P_i h_{m-i} = \gamma_{m-i}) \quad (21)$$

where $$P_{i+1} = P_i - (P_i h_{m-i} h'_{m-i} P_i)/(h'_{m-i} P_i h_{m-i} + \gamma_{m-i}) \quad (22)$$

$$i = 0, \ldots, m-i$$

and $$P_o = Q. \quad (23)$$

The deviations from the design values of the target values for the adjustable resistors are $$\hat{u}_k = F_k x_k \quad (24)$$

and the target value of conductance for an adjustable resistor is then $$\hat{G}_k = (l + \hat{u}_k)G_k \quad (25)$$

The entries in coefficient weighting matrix Q are chosen to give the desired emphasis to each transfer function coefficient. For example, if $$Q = \begin{bmatrix} 1/K^2 & & & O \\ & 1/b_o^2 & & \\ & & \ddots & \\ O & & & 1/a_{n-1}^2 \end{bmatrix} \quad (26)$$

the term $x'_{m+1}Qx_{m+1}$, when evaluated, will be the sum of the squares of the deviations in each of the coefficients. A particular coefficient can be emphasized or de-emphasized by multiplying its term in matrix Q by an appropriate factor. For example, if the subject circuit is a filter, it may be more important to minimize deviations in coefficients $a_x$ and $b_x$ pertaining to poles and zeros than in coefficient K pertaining to gain. Thus, matrix Q could be rewritten to assign a zero weight to the gain term as follows:

$$Q = \begin{bmatrix} O & & & O \\ & 1/b_o^2 & & \\ & & \ddots & \\ O & & & 1/a_{n-1}^2 \end{bmatrix} \quad (27)$$

It will be clear to those skilled in the art that the above method of determining feedback factors can be implemented on a digital computer.

Table I contains exemplary nominal component values, sensitivity factors, and feedback factors for the first stage in circuit 100. The feedback factors were calculated by the above-described method. In this example, seven transfer function coefficients are used as monitor parameters. Similar tables can be determined for the second and third stages of circuit 100.

TABLE I

| A. Nominal Component Values | RESISTANCE-KOHMS | | CAPACITANCE-PF |
|---|---|---|---|
| $R_1$ | 50 | $C_1$ | 638 |
| $R_2$ | 100 | $C_2$ | 319 |
| $R_3$ | 33.3 | $C_3$ | 957 |
| $R_4$ | 118.1 | $C_4$ | 278 |
| $R_5$ | 50 | | |
| $R_6$ | 88.1 | | |

B. Sensitivity factors relating capacitance to monitor parameters (SCAP)

| | Capacitor | | | |
|---|---|---|---|---|
| Parameter | $C_1$ | $C_2$ | $C_3$ | $C_4$ |
| 1 | 0.22609 | 0.45217 | 0.00000 | −0.67826 |
| 2 | −0.38712 | −0.29699 | −0.47725 | −0.27040 |
| 3 | −0.12831 | −1.40263 | 0.15571 | 0.29966 |
| 4 | 0.38831 | −1.00535 | −1.03229 | 0.54417 |
| 5 | −1.10113 | −1.10113 | −1.10113 | 0.00000 |
| 6 | −0.35521 | −0.71041 | −1.06562 | 0.00000 |
| 7 | 0.00000 | 0.00000 | −1.03229 | 0.00000 |

C. Sensitivity factors relating dissipation factors to monitor parameters (SCON)

| | Capacitor | | | |
|---|---|---|---|---|
| Parameter | $C_1$ | $C_2$ | $C_3$ | $C_4$ |
| 1 | 0.00000 | 0.00000 | 0.00000 | 0.00000 |
| 2 | 0.30791 | −1.06798 | 0.69349 | 0.60436 |
| 3 | 1.28475 | −0.31763 | 0.07287 | 1.17033 |
| 4 | 0.81114 | 0.62228 | 1.00000 | 0.56658 |
| 5 | 0.71041 | 0.35521 | 0.00000 | 0.00000 |
| 6 | 1.03229 | 1.03229 | 0.00000 | 0.00000 |
| 7 | 1.00000 | 1.00000 | 1.00000 | 0.00000 |

D. Feedback factors relating monitor parameters to target values of resistors (FB)

| Parameter | Resistor | | | | | |
|---|---|---|---|---|---|---|
| | $R_1$ | $R_2$ | $R_3$ | $R_4$ | $R_5$ | $R_6$ |
| 1 | 0.00000 | 0.00000 | 0.00000 | 0.00000 | 0.00000 | 0.00000 |
| 2 | 0.74103 | −0.07062 | 0.00000 | 0.14134 | 0.83885 | 0.29627 |
| 3 | −1.02033 | 0.46155 | 0.00000 | −0.92320 | −0.29311 | 0.46421 |
| 4 | 1.05309 | −0.05407 | 0.00000 | 0.10826 | −0.37025 | 0.11753 |
| 5 | 0.32118 | −0.03061 | 0.00000 | 0.06126 | 0.36358 | 0.12841 |
| 6 | −1.15673 | −0.26681 | 0.00000 | 0.53352 | −0.12371 | 0.13269 |
| 7 | 1.23695 | −0.09181 | 0.00000 | 0.18358 | −0.04257 | 0.04566 |

E. Sensitivity factors relating measured values of adjusted resistors to monitor parameters (SRES)

| Parameter | Resistor | | | | | |
|---|---|---|---|---|---|---|
| | $R_1$ | $R_2$ | $R_3$ | $R_4$ | $R_5$ | $R_6$ |
| 1 | 0.00000 | −0.76369 | 0.00000 | 0.76369 | 0.00000 | 0.00000 |
| 2 | 0.47725 | 0.00000 | 0.00000 | 0.00000 | 0.47725 | 0.47725 |
| 3 | 0.05015 | 1.22193 | 0.00000 | −1.22193 | 0.07592 | 0.94950 |
| 4 | 0.68819 | 1.18371 | 0.00000 | −1.18371 | −0.59826 | 1.01522 |
| 5 | 1.10113 | 0.00000 | 0.00000 | 0.00000 | 1.10113 | 1.10113 |
| 6 | 1.06562 | 0.00000 | 0.00000 | 0.00000 | 0.00000 | 1.06562 |
| 7 | 0.68819 | 0.00000 | 0.00000 | 0.00000 | 0.00000 | 0.34410 |

The adjusting methods described so far have been deterministic, that is, the methods have comprised adjusting passive components to target values in a circuit that is not necessarily either complete or able to function. An embodiment of the invention will now be described in which the adjusting method is functional, that is, wherein measurable relationships in an operating circuit are used as monitor parameters and components are adjusted to correct changes in these monitor parameters with respect to design values.

Referring again to FIG. 2, assume that all resistors in circuit 100 have been adjusted to target values, such as by using the deterministic adjusting methods described above, and that operational amplifiers 101, 102, and 103 have been assembled into circuit 100 and that the circuit can be operated. As mentioned above, an appropriate functional test for a circuit such as circuit 100 is to measure the gain or the phase shift of the circuit at a number of frequencies, for example, by applying an input signal of an appropriate magnitude and frequency to the input terminals of circuit 100 and measuring the magnitude and phase of the signal at the output terminals of circuit 100 in relation to the input signal. Then, components in the circuit are adjusted to bring the gain or phase shift being measured within design tolerances, and the changes in the gain or phase shift with respect to their design values are used to monitor the functional adjusting process. Thus, gain and/or phase shift at specified frequencies can be the monitor parameters.

Usually, only a few components in a circuit are selected for functional adjustment. After the initial values of the monitor parameters are measured, a computer can determine target values for the selected adjustable components using feedback factors that relate changes from design values in the monitor parameters to compensating changes in the adjustable components in a similar manner to the deterministic methods of finding target values for components described above. However, it may not be convenient to measure component values directly during a functional test, and since the same end can be attained indirectly by additional measurements of the parameters being monitored, such indirect measurements are preferred.

For example, considering again circuit 100 in FIG. 3, assume that a suitable functional test for circuit 100 is to measure phase shift at frequency $f_1$, gain at frequency $f_2$, and phase shift at frequency $f_3$; that design values and tolerances for these relationships are established; and that changes from design values in these relationships can be corrected satisfactorily by adjusting resistors $R_3$, $R_9$, and $R_{17}$. These gains and phase shifts can be used as the monitor parameters. A table of feedback factors that relate changes in these monitor parameters to compensating changes in value of resistors $R_3$, $R_9$, and $R_{17}$ could be calculated. However, changing the value of a component, such as $R_3$, $R_9$, or $R_{17}$, will also cause changes in the monitor parameters, and one of the monitor parameters will undoubtedly be affected more than others by a change in a given component. Instead of measuring the actual value of a component being adjusted, then, it is preferred to measure this change indirectly by measuring the change in the monitor parameter that is most sensitive to changes in that component.

With respect to the functional adjusting method of the invention, it is preferred to use feedback factors that relate changes in a monitor parameter to be corrected to changes in monitor parameters that result when given components are adjusted to accomplish the corrections. In circuit 100, for example, assume that gain at frequency $f_2$ is the monitor parameter most responsive to changes in resistor $R_3$. Then, feedback factors relating each monitor parameter being monitored to desired changes in resistor $R_3$ would be calculated instead to relate each monitor parameter to desired changes in gain at frequency $f_2$. Note that it could be possible for a deviation in gain at $f_2$ from design value to require correction, and for this deviation, along with deviations in the other parameters being monitored, to prescribe an adjustable component change that is itself defined by a change in gain at $f_2$. This latter change may not necessarily bring the gain at $f_2$ within final tolerances if other components still remain to be adjusted.

In any practical circuit, the various monitor parameters and adjustable components will be interrelated, that is, adjusting a given component will typically affect more than one monitor parameter. Thus, as mentioned above, it is desirable to use an optimization procedure to determine the best combination of feedback factors to correct for deviations in the monitor parameters being measured, and again an empirical procedure may be necessary to determine an appropriate adjustment sequence.

According to the invention, off-line calculations are performed to determine feedback factors relating changes from design values in monitor parameters to compensating changes in adjustable components, the latter changes themselves being defined as changes in monitor parameters that result from adjusting the components. Then, on line, these feedback factors are used in conjunction with measured changes in the monitor parameters to determine a target value for a monitor parameter chosen to indicate the change in an adjustable component. Then, the adjustable component is adjusted as that monitor parameter is observed until that monitor parameter reaches its target value. All the monitor parameter changes are then remeasured, and the above steps repeated for each adjustable component.

If a monitor parameter is still out of tolerance after the last adjustable component has been adjusted, the functional adjustment process can be repeated to attempt to correct the out-of-tolerance parameter. Keeping in mind, however, that components typically can only be adjusted one way—a thin-film resistor can only be increased in value, for example—it is not likely that more than two repetitions of the adjustment process will be fruitful.

Figure 7:
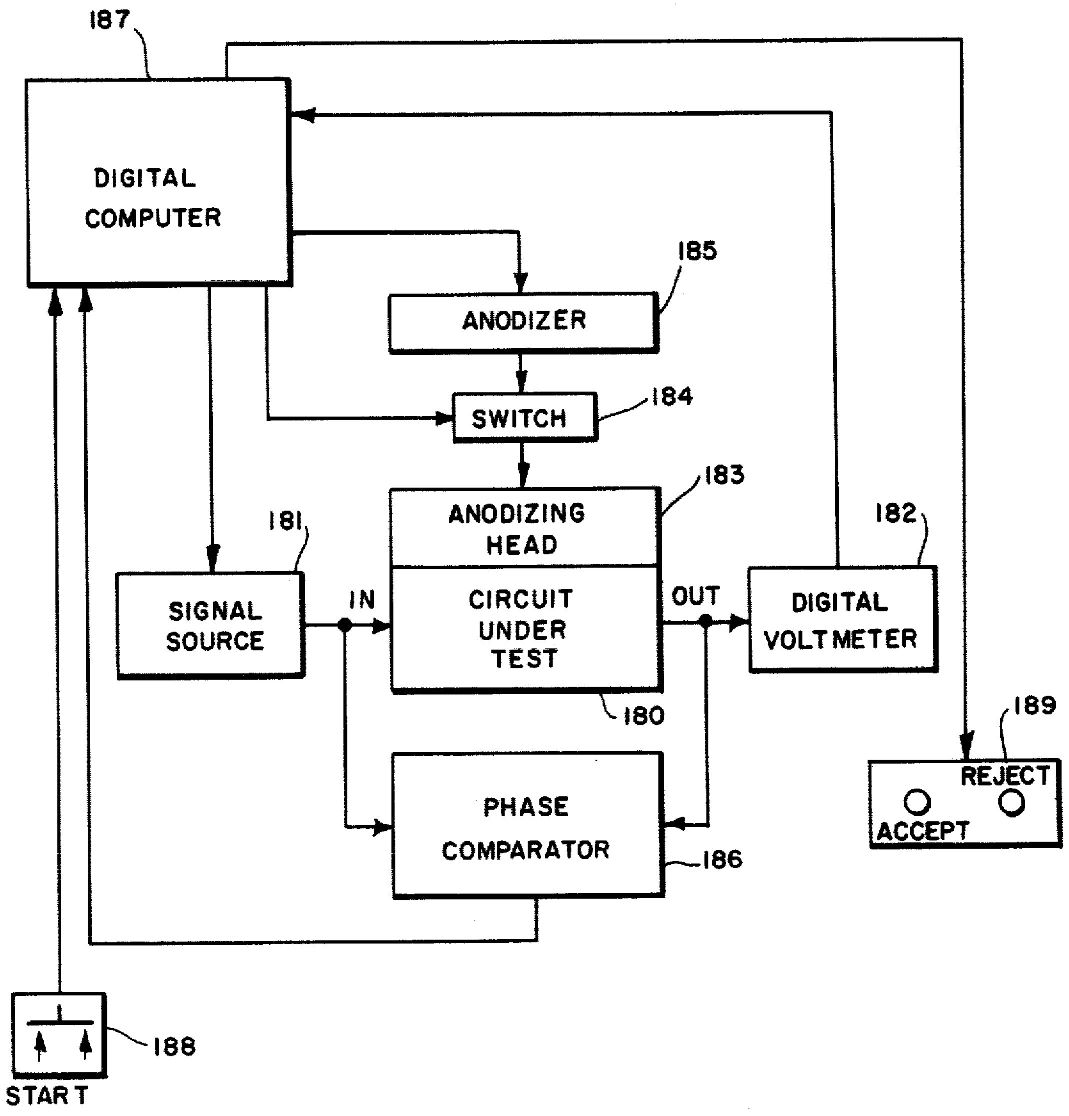
FIG. 7 is a schematic diagram of exemplary apparatus for functional adjustment of circuit components according to the method of the invention.

FIG. 7 is a block diagram of exemplary apparatus for functional adjustment of a circuit according to the invention. A circuit 180 under test has its input connected to signal source 181 and its output connected to digital voltmeter 182. Anodizing head 183 is disposed next to circuit 180 to adjust selected resistors on circuit 180, and is connected to anodizer 184. Phase comparator 185 is connected to the input and output of circuit 180 to compare the phase of the input and output signals of circuit 180. Source 181, voltmeter 182, switch 184, anodizer 185, comparator 186, START button 188, and indicator 189 are connected to computer 187. All this apparatus is well known in the art, for example, as described in the Dupcak et al. article noted above. Computer 187 contains feedback factors, which can be calculated off-line, and controls source 181, voltmeter 182, and comparator 186 to measure functional parameters of circuit 180 at selected frequencies, then using the feedback factors, controls switch 184 and anodizer 185 to selectively adjust adjustable resistors on circuit 180 to correct for changes from design value in the monitor parameters.

Figure 8:
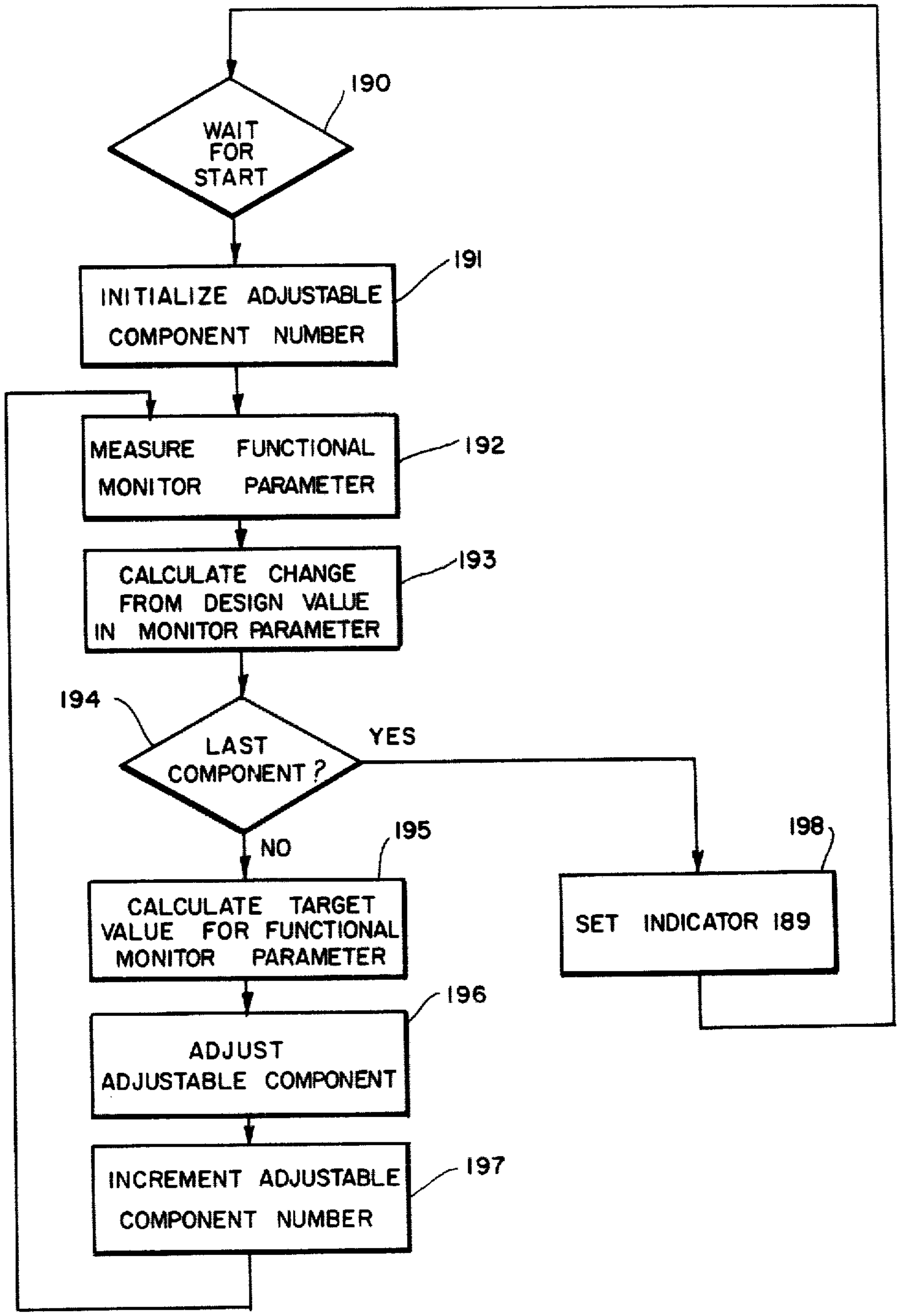
FIG. 8 is a flow chart of a computer program for a digital computer in the apparatus of FIG. 7.

FIG. 8 is a flow chart of a program for computer 187 to operate the apparatus in FIG. 7 according to the method of the invention. The blocks in this flow chart will now be described.

Block 190

Computer 187 waits for the operator to depress START button 187 to indicate that a circuit 180 is ready to be adjusted.

Block 191

Computer 187 is initialized for the first component to be adjusted on circuit 180 by executing a statement such as

```
CN=1                                    (61)
```

CN identifies the component to be adjusted.

Block 192

Computer 187 controls signal source 181, digital voltmeter 182, and phase comparator 185 to measure the functional parameters of circuit 180.

Block 193

Computer 187 calculates the monitor parameters for circuit 180 to be the percent deviations in the measured functional parameters from their design values by executing statements such as:

```
      DO 30 J = 1,NFPAR                     (62)
30    FPAR(J) = (MPAR(J)
        - DPAR(J))/DPAR(J)                  (63)
```

NFPAR is the number of functional parameters, FPAR is the set of monitor parameters, MPAR is the set of functional parameters measured in block 192 and DPAR is the set of design values for the functional parameters.

Block 194

Computer 187 determines whether all adjustable components on circuit 180 have been adjusted by executing statements such as:

```
IF(CN.LT.HAC)GO TO 31                       (64)
```

HAC is the number of the highest-numbered adjustable component on circuit 180.

Block 195

Computer 187 calculates a target value for the functional parameter to be used as a measure in adjusting the next adjustable component on circuit 180 by executing statements such as:

```
31   TPN = PN(CN)                           (65)
     DP = 0                                 (66)
     DO 32 J = 1,NPAR                       (67)
32   DP = DP + FFB(J,CN)*FPAR(J)            (68)
     TPAR = (1. + DP)*MPAR(TPN)             (69)
```

PN is a list identifying the functional parameter to be used for monitoring the adjustment of a particular component. FFB is the table of feedback factors relating the monitor parameters to the functional parameters used to monitor the adjustable components. TPN identifies the functional parameter to be used to monitor the adjustment of the component identified by CN. DP is the percent change from the last measured value that is to occur in parameter TPN during adjustment of component CN, and TPAR is the target value for the parameter TPN.

Block 196

Computer 187 controls anodizer 184 and switch 185 to anodize resistor CN, controls signal source 181 to supply an appropriate input signal to circuit 180 for measuring functional parameter TPN, and receives information from digital voltmeter 182 and/or phase comparator 186 for measuring functional parameter TPN in bringing this parameter to its target value TPAR.

Block 197

Computer 187 is set for the next component to be adjusted by executing a statement such as:

$$CN = CN + 1 \quad (70)$$

Block 198

Computer 187 compares the magnitudes of the monitor parameters for circuit 180 with limit values and sets indicator 189 to ACCEPT if the parameter magnitudes are within limits, or REJECT if the parameter magnitudes are out of limits, by executing statements such as:

| | | |
|---|---|---|
| | DO 33 J = 1,NFPAR | (71) |
| | AFPAR = ABS(MPAR(J)) | (72) |
| 33 | IF(AFPAR . GT . HFPAR(J))GO TO 200 | (73) |
| | Set indicator 189 to ACCEPT, Return to block 190 | (74) |
| 200 | Set indicator 189 to REJECT, Return to block 190 | (75) |

HFPAR is a set of maximum permissible magnitudes for the monitor parameters. AFPAR is an intermediate variable having the magnitude of the monitor parameter being checked. Statements 74 and 75 describe the actions performed by computer 187 with respect to indicator 189. Again, other methods can be used for determining acceptable or unacceptable adjusted circuits 180 from the values of the monitor parameters.

If a circuit 180 is rejected according to whatever criteria are used in the steps of block 196, it may be possible to render the circuit acceptable by repeating the above-described adjusting sequence. Thus, block 198 could include steps to return to block 190 if the circuit 180 just adjusted is accepted, or to block 191 to repeat the adjusting sequence if the circuit 180 is rejected, and to finally reject the circuit, and so set indicator 189, only after the adjusting sequence has been unsuccessful a preset number of times.

One skilled in the art may make changes and modifications to the embodiments of the invention disclosed herein, and may devise other embodiments, without departing from the spirit and scope of the invention.

What is claimed is:

1. A method for controlling the adjustment of a plurality of machine-adjustable components in a circuit, the method comprising:

(a) determining any change from a design value of a circuit monitor parameter, which parameter expresses a characteristic of the circuit;

(b) calculating a target value for a first one of said machine-adjustable components using:

(i) the circuit monitor parameter change determined in step (a); and (ii) a predetermined feedback factor which relates the change from design value in the circuit monitor parameter to a compensating change from the design value in the adjustable component;

(c) adjusting a first one of the adjustable components towards the target value determined for said component in step (b); and (d) repeating steps (a) through (c) for each adjustable component whereby the adjustments to all priorly adjusted components are taken into account in subsequent component adjustments.

2. The method of claim 1 wherein the circuit further includes a fixed component; step (a) further comprises:

(e) calculating a sensitivity factor which converts change from design value in the fixed component to a compensating change from design value in the circuit monitor parameter; and step (b) comprises:

(f) measuring the value of the fixed component, and (g) calculating the value for the change in the circuit monitor parameter using at least the measured and design values of the fixed component measured in step (f) and the sensitivity factor calculated in step (e).

3. The method of claim 1 wherein the circuit is operating, the circuit monitor parameter compares an input signal of the circuit to an output signal of the circuit, and step (b) comprises directly measuring the circuit monitor parameter and calculating the change between the measured and design values of the circuit monitor parameter.

4. The method of claim 3 wherein the circuit monitor parameter is gain at a selected frequency.

5. The method of claim 3 wherein the circuit monitor parameter is phase shift at a selected frequency.

6. The method of claim 3 wherein step (c) comprises expressing the target value of the adjustable component as a target value for another circuit monitor parameter comparing an input signal of the circuit to an output signal of the circuit, and step (d) comprises adjusting the adjustable component until the other circuit monitor parameter reaches its target value.

7. For use with a circuit having a fixed component and a plurality of machine-adjustable components, a method of controlling the adjustment of the adjustable components, which comprises:

in a preliminary computing step:

(a) calculating a sensitivity factor by comparing a change from design value in the fixed and the adjustable components to a change from design value in a circuit monitor parameter, which expresses a characteristic of the circuit;

(b) determining a feedback factor which converts a desired change in the circuit monitor parameter to an equivalent change from design value in each of the adjustable components;

by machine means:

(c) measuring the value of the fixed component;

(d) calculating a value for the change in the circuit monitor parameter using the measured and design values of the fixed component measured in step (c) and the sensitivity factor calculated in step (a);

(e) calculating a target value for a first one of the adjustable components using the circuit monitor parameter change calculated in step (d), the feedback factor determined in step (b), and the design value for the first adjustable component;

(f) adjusting the first one of the adjustable components towards its target value; and (g) repeating steps (e) and (f) for each adjustable component whereby the adjustments to all priorly adjusted components are taken into account in subsequent component adjustments.

8. The method of claim 7 wherein the circuit monitor parameter is a transfer-function coefficient of the circuit.

9. For use with a circuit having a fixed component and a plurality of machine-adjustable components, a method of controlling the adjustment of the adjustable components, which comprises:

in a preliminary computing step:

(a) for each component, calculating a sensitivity factor by converting a change from design value in that component to a compensating change from design value in a circuit monitor parameter expressing a characteristic of the circuit;

(b) for each adjustable component, determining a feedback factor which converts a given change from design value in the circuit monitor parameter to a compensating change from design value in that adjustable component;

by machine means:

(c) measuring the value of the fixed component;

(d) initializing a value for the change in the circuit monitor parameter using at least the measured and design values of the fixed component measured in step (c) and the sensitivity factor for that component calculated in step (a);

(e) calculating a target value for one of the adjustable components using the circuit monitor parameter change, the feedback factor for that adjustable component determined in step (b), and the design value for that adjustable component;

(f) revising the circuit monitor parameter change using the design and target values for the adjustable component calculated in step (e) and the sensitivity factor for that component calculated in step (a);

(g) repeating steps (e) and (f) for each adjustable component in turn except the final adjustable component;

(h) repeating step (e) for the final adjustable component; and (i) adjusting the adjustable components towards their target values.

10. The method of claim 9 wherein the circuit monitor parameter is a transfer-function coefficient of the circuit.

11. For use with a circuit having a fixed component and a plurality of machine-adjustable components, a method of controlling the adjustment of the adjustable components, which comprises:

in a preliminary computing step:

(a) for each component, calculating a sensitivity factor by converting a change from design value in that component to a compensating change from design value in a circuit monitor parameter expressing a characteristic of the circuit;

(b) for each adjustable component, determining a feedback factor which converts a given change in the monitor parameter to a compensating change from design value in that adjustable component;

by machine means:

(c) measuring the value of the fixed component;

(d) initializing a value for the change in the circuit monitor parameter using the measured and design values of the fixed component measured in step (c) and the sensitivity factor for that component calculated in step (a);

(e) calculating a target value for one of the adjustable components using the circuit monitor parameter change, the feedback factor for that adjustable component calculated in step (b), and the design value for that adjustable component;

(f) adjusting the adjustable component in step (e) towards its target value;

(g) measuring the adjusted value of the adjustable component changed in step (f);

(h) revising the circuit monitor parameter change using the design and measured values of the adjustable component measured in step (g) and the sensitivity factor for that component calculated in step (a); and (i) repeating steps (e), (f), (g), and (h) for each remaining adjustable component in turn.

12. The method of claim 11 wherein the circuit monitor parameter is a transfer-function coefficient of the circuit.

13. For use with a circuit having a fixed component and a plurality of machine-adjustable components, a method of controlling the adjustment of the adjustable components, which comprises:

in a preliminary computing step:

(a) for each component, calculating a sensitivity factor by converting a change from design value in that component to a compensating change from design value in a circuit monitor parameter expressing a characteristic of the circuit;

(b) classifying the adjustable components into groups;

(c) for each adjustable component, determining a feedback factor which converts a given change in the circuit monitor parameter to a compensating change from design value in the adjustable component;

by machine means:

(d) measuring the value of the fixed component;

(e) initializing a value for the change in the circuit monitor parameter using the measured and design values of the fixed component measured in step (d) and the sensitivity factor for that component calculated in step (a);

(f) setting a group parameter change equal to the circuit monitor parameter change;

(g) calculating a target value for one of the adjustable components in a selected group using the group parameter change, the feedback factor for that adjustable component calculated in step (c), and the design value for that adjustable component;

(h) revising the group parameter change using the design and target values for the adjustable component calculated in step (g) and the sensitivity factor for that component calculated in step (a);

(i) repeating steps (g) and (h) for each adjustable component in turn in the selected group;

(j) adjusting each adjustable component in the selected group towards its target value;

(k) measuring the actual value of each adjustable component in the selected group;

(l) revising the circuit monitor parameter change using the measured and designed values of the adjustable components measured in step (k) and the sensitivity factors for those components calculated in step (a);

(m) repeating steps (f), (g), (h), (i), (j), (k), and (l) for each group in turn except the final group; and (n) repeating steps (f), (g), (h), (i), and (j) for the final group.

14. The method of claim 13 wherein the circuit monitor parameter is a transfer-function coefficient of the circuit.

15. For use with a circuit having both machine-adjustable and non-adjustable components, a method of controlling the adjustment of the adjustable components, which comprises:

in a preliminary computing step:

(a) for each combination of component and each of a plurality of circuit monitor parameters expressing characteristics of the circuit, calculating a sensitivity factor by converting a change from design value in the component to a compensating change from design value in the circuit monitor parameter;

(b) classifying the adjustable components into groups;

(c) for each combination of circuit monitor parameter and adjustable component, determining a feedback factor which converts a given change from design value in the circuit monitor parameter to a compensating change from design value in the adjustable component;

by machine means:

(d) measuring the values of the non-adjustable components;

(e) for each combination of circuit monitor parameter and non-adjustable component, determining a value for the change in the circuit monitor parameter using at least the measured and design values of the non-adjustable component measured in step (d) and the sensitivity factor calculated in step (a) relating that parameter to that non-adjustable component;

(f) determining an accumulated circuit monitor parameter change for each circuit monitor parameter from the changes determined in step (e);

(g) for each circuit monitor parameter, setting a group parameter change equal to the accumulated circuit monitor parameter change;

(h) calculating a target value for one of the adjustable components in one of the groups using the group parameter changes, the feedback factors determined in step (c) for that adjustable component, and the design value for that adjustable component;

(i) revising the group parameter change for each parameter using the target and design values for the adjustable component calculated in step (h) and the sensitivity factors calculated in step (a) for that component;

(j) repeating steps (h) and (i) for each adjustable component in the group;

(k) adjusting each adjustable component in the group towards its target value;

(l) measuring the actual value of each adjustable component in the group;

(m) for each adjustable component in the group, revising each accumulated circuit monitor parameter change by using the measured and design values of the adjustable component measured in step (l) and the sensitivity factors calculated in step (a) relating that adjustable component to the respective circuit monitor parameters;

(n) repeating steps (g), (h), (i), (j), (k), (l), and (m) for each group in turn except the final group; and (o) repeating steps (g), (h), (i), (j), and (k) for the final group.

16. The method of claim 15 wherein the circuit monitor parameters are transfer-function coefficients of the circuit.

17. A method of controlling the adjustment of a machine-adjustable component in an operating circuit to minimize deviations from design value in a circuit monitor parameter, the circuit monitor parameter comparing an input signal of the circuit and an output signal of the circuit, which comprises:

in a preliminary computing step:

(a) determining a feedback factor which converts a change from design value in a first circuit monitor parameter to a compensating change in value of the adjustable component, by machine means:

(b) measuring the actual value of the first circuit monitor parameter, (c) calculating a target value for the adjustable component using the design and measured values of the first circuit monitor parameter measured in step (b) and the feedback factor determined in step (a), and (d) adjusting the adjustable component towards its target value.

18. The method of claim 17 wherein a change in value of the adjustable component is indicated by a change in value of a second circuit monitor parameter relating an input signal of the circuit to an output signal of the circuit, step (c) comprises calculating a target value for the second monitor parameter and step (d) comprises adjusting the adjustable component until the second monitor parameter reaches substantially its target value.

19. The method of claim 17 wherein one of the circuit monitor parameters is gain at a selected frequency.

20. The method of claim 17 wherein one of the circuit monitor parameters is phase shift at a selected frequency.

* * * * *